(12) United States Patent
Nagao

(10) Patent No.: US 7,965,535 B2
(45) Date of Patent: Jun. 21, 2011

(54) ELECTRODE MASTER FOR FERROELECTRIC RECORDING AND METHOD FOR RECORDING ON FERROELECTRIC RECORDING MEDIUM

(75) Inventor: Makoto Nagao, Odawara (JP)

(73) Assignee: Fujifilm Corporation, Tokyo (JP)

( * ) Notice: Subject to any disclaimer, the term of this patent is extended or adjusted under 35 U.S.C. 154(b) by 141 days.

(21) Appl. No.: 12/412,605

(22) Filed: Mar. 27, 2009

(65) Prior Publication Data

US 2009/0244952 A1 Oct. 1, 2009

(30) Foreign Application Priority Data

Mar. 27, 2008 (JP) ................. 2008-084431

(51) Int. Cl.
*G11C 11/22* (2006.01)
(52) U.S. Cl. ............. 365/145; 365/80; 365/87; 365/126
(58) Field of Classification Search .................. 365/145, 365/80, 87, 126
See application file for complete search history.

(56) References Cited

U.S. PATENT DOCUMENTS

| | | | | |
|---|---|---|---|---|
| 6,064,587 A | * | 5/2000 | Jo ................................ | 365/145 |
| 7,626,846 B2 | * | 12/2009 | Rao et al. ...................... | 365/145 |
| 7,782,649 B2 | * | 8/2010 | Tran et al. ..................... | 365/145 |
| 2004/0042351 A1 | * | 3/2004 | Onoe et al. .................. | 369/13.01 |
| 2008/0175033 A1 | * | 7/2008 | Wang et al. ................... | 365/145 |

FOREIGN PATENT DOCUMENTS

| | | |
|---|---|---|
| JP | 2004-014016 | 1/2004 |
| JP | 2006-268894 | 10/2006 |

OTHER PUBLICATIONS

Formation of Ultimately Tiny Domain Dot with Offset Voltage Application Method written by RIEC, Tohoku Univ., Tanaka Kenkou and Cho Yasou.

* cited by examiner

*Primary Examiner* — Pho M Luu
(74) *Attorney, Agent, or Firm* — Young & Thompson

(57) ABSTRACT

An electrode master for ferroelectric recording records information on a ferroelectric recording medium in which the direction of polarization of a ferroelectric material has been unified in one direction by applying a voltage thereto, based on the direction of polarization of the ferroelectric material, by applying voltage pulses to the ferroelectric recording medium. The electrode master includes an electroconductive base material; a plurality of electrode convexes provided on a surface of the electroconductive base material so as to correspond to information to be recorded on the ferroelectric recording medium; and an electrode terminal conducted to each of the electrode convexes and provided on the electroconductive base material.

9 Claims, 4 Drawing Sheets

ELECTRODE MASTER FOR FERROELECTRIC RECORDING AND METHOD FOR RECORDING ON FERROELECTRIC RECORDING MEDIUM

BACKGROUND OF THE INVENTION

1. Field of the Invention

The present invention relates to an electrode master for ferroelectric recording and a method for recording on a ferroelectric recording medium using the electrode master for ferroelectric recording.

2. Description of the Related Art

As described, for example, in Japanese Patent Application Laid-Open (JP-A) No. 2004-14016, a high-density record/reproducing method utilizing a ferroelectric probe memory by taking advantage of a nonlinear effect attained by permittivity has been proposed, for example, by Cho (a professor of Tohoku University). This record/reproducing method utilizes a technique of SNDM (scanning nonlinear dielectric microscopy) that can analyze dielectric materials on a nanoscale, and, at the present time, practical use of the record reproducing method is studied. Currently, a recording density of 80 Tbits/in$^2$ has been demonstrated in the ferroelectric probe memory ("Extended Abstracts of the 68th Meeting of the Japan Society of Applied Physics," p. 694, 7a-P13-15).

A servo tracking technique is one of techniques important for the practical use of the ferroelectric probe memory. The ferroelectric probe memory is expected as a next-generation high-density large-capacity recording medium. Accordingly, this leads to a significant increase in the amount of servo signals to be recorded on the recording medium as compared with conventional HDDs (hard disk drives) and the like.

For example, recording of servo signals one by one on the ferroelectric probe memory using, as a recording head, a needle electrode in a probe, as described, for example, in Japanese Patent Application Laid-Open (JP-A) No. 2006-268894 disadvantageously requires an enormous amount of time for recording.

Further, the use of the ferroelectric probe memory as a read-only recording medium is also considered. In this case, a method for recording information at a high speed in data area is desired. Unfortunately, however, any method for simultaneously recording pieces of information on the recording medium has not been proposed.

BRIEF SUMMARY OF THE INVENTION

The present invention has been made with a view to solving the above problems of the related art and attaining the following object.

Thus, an object of the present invention is to provide an electrode master for ferroelectric recording and a method for recording on a ferroelectric recording medium using the electrode master for ferroelectric recording, which can simultaneously record a plurality of pieces of information on a ferroelectric recording medium.

The following are means for solving the aforesaid problems:

<1> An electrode master for ferroelectric recording that records information on a ferroelectric recording medium in which the direction of polarization of a ferroelectric material has been unified in one direction by applying a voltage thereto, based on the direction of polarization of the ferroelectric material by applying voltage pulses to the ferroelectric recording medium, the electrode master comprising:

an electroconductive base material;

a plurality of electrode convexes provided on a surface of the electroconductive base material so as to correspond to information to be recorded on the ferroelectric recording medium; and an electrode terminal conducted to each of the electrode convexes and provided on the electroconductive base material.

The electrode master for ferroelectric recording according to the item <1> includes an electroconductive base material, a plurality of electrode convexes provided on a surface of the electroconductive base material so as to correspond to information to be recorded on the ferroelectric recording medium and an electrode terminal conducted to each of the electrode convexes and provided on the electroconductive base material. According to this construction, upon the application of voltage pulses to the ferroelectric recording medium using the electrode master for ferroelectric recording, a plurality of pieces of information corresponding to the electrode convexes are simultaneously recorded on the ferroelectric recording medium.

<2> The electrode master for ferroelectric recording according to the item <1>, wherein the electrode convexes and the electroconductive base material are formed of a metal.

<3> The electrode master for ferroelectric recording according to one of the items <1> and <2>, wherein concaves between the electrode convexes provided on the surface of electroconductive base material are filled with an insulator.

<4> A method for recording on a ferroelectric recording medium, including:

placing a ferroelectric recording medium, on which information is recorded based on the direction of polarization of a ferroelectric material, between the electrode master for ferroelectric recording according to any one of the items <1> to <3> and another electrode so as to bring a plurality of electrode convexes in the electrode master for ferroelectric recording into contact with the ferroelectric recording medium; and applying voltage pulses to the ferroelectric recording medium to record a plurality of pieces of information on the ferroelectric recording medium.

<5> The method for recording on a ferroelectric recording medium according to the item <4>, wherein voltage pulses are applied to the ferroelectric recording medium with allowing the plurality of electrode convexes in the electrode master for ferroelectric recording to come close to, but allowing these electrode convexes to contact with, the ferroelectric recording medium to record a plurality of pieces of information on the ferroelectric recording medium.

<6> A ferroelectric recording medium on which information is recorded by using the electrode master for ferroelectric recording according to any one of the items <1> to <3>.

<7> A recording and reproducing apparatus which records information on a ferroelectric recording medium by the recording method according to the item <5> or on the ferroelectric recording medium according to the item <6>, and which reproduces the information recorded on the ferroelectric recording medium.

<8> A reproduction-only apparatus which reproduces information that has been recorded on a ferroelectric recording medium by the recording method according to the item <5> or reproduces information that has been recorded on the ferroelectric recording medium according to the item <6>

The present invention can solve the problems of the related art and can provide an electrode master for ferroelectric recording and a method for recording on a ferroelectric recording medium using the electrode master for ferroelectric recording, which can simultaneously record a plurality of pieces of information on an ferroelectric recording medium.

DETAILED DESCRIPTION OF THE INVENTION

The electrode master for ferroelectric recording according to one embodiment of the present invention and the method for recording on a ferroelectric recording medium using the electrode master for ferroelectric recording will be described with reference to the accompanying drawings.

Figure 1:
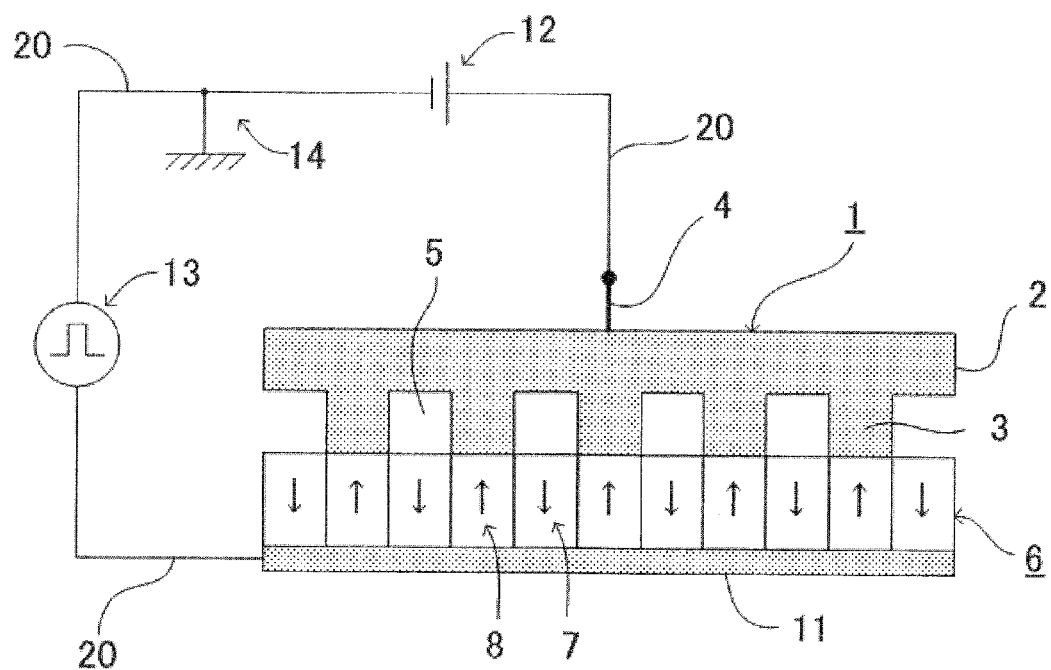
FIG. 1 is an explanatory view illustrating a method for simultaneously recording information on a ferroelectric recording medium using an electrode master for ferroelectric recording.

FIG. 1 is an explanatory view illustrating a method for simultaneously recording information on a ferroelectric recording medium using an electrode master for ferroelectric recording. At the outset, an electrode master 1 for ferroelectric recording will be described.

[Electrode Master for Ferroelectric Recording]

The electrode master 1 for ferroelectric recording includes an electroconductive base material 2, electrode convexes 3, and an electrode terminal 4. The electrode master 1 for ferroelectric recording functions as an electrode for simultaneously recording information on a ferroelectric recording medium.

(Electroconductive Base Material)

The electroconductive base material 2 is provided for arranging a plurality of electrode convexes 3 on its surface. The form of the electroconductive base material 2 is not particularly limited and may be properly selected according to the purpose. The electroconductive base material 2 may be, for example, in a disc form.

The electroconductive base material 2 may be formed of any electroconductive material without particular limitation. Examples of such materials include carbon and metals such as nickel, and the material may be selected according to the purpose. The material for the electroconductive base material 2 is particularly preferably nickel. The selection of nickel as the material for the electroconductive base material 2 or the like is advantageous in that an electrode master 1 for ferroelectric recording can be produced by electroforming using a predetermined mother die.

The thickness of the electroconductive base material 2 is not particularly limited and may be properly selected according to the purpose. The thickness of the base material 2 is preferably 10 µm to 1 mm, more preferably 50 µm to 500 µm. When the thickness of the base material 2 is more than 1 mm, the flexibility of the electroconductive base material 2 (electrode master 1 for ferroelectric recording) is unsatisfactory. In this case, the contact of the base material 2 with the ferroelectric recording medium is sometimes unsatisfactory. When the thickness of the electroconductive base material 2 is less than 10 µm, the strength of the electroconductive base material 2 (electrode master 1 for ferroelectric recording) is unsatisfactory. In this case, handling in transfer is sometimes difficult.

(Electrode Convexes)

The electrode convexes 3 are arranged on a surface of the electroconductive base material 2 so as to correspond to information to be recorded on a ferroelectric recording medium. The electrode convexes 3 may be formed integrally with the electroconductive base material 2, or alternatively may be formed separately from the electroconductive base material 2.

From the viewpoint of ease of production and the like, however, preferably, the electrode convexes 3 are formed integrally with the electroconductive base material 2 and so as to extend (in a protruded form) from the surface of the electroconductive base material 2.

The electrode convexes 3 may be formed of any electroconductive material without particular limitation. Examples of such materials include carbon and metals such as nickel, and the material may be selected according to the purpose. For example, when the electrode convexes 3 are formed integrally with the electroconductive base material 2, the electrode convexes 3 are formed of the same material as the material for the electroconductive base material 2.

As shown in FIG. 1, the electrode convexes 3 are provided in a protruded form on the surface of the electroconductive base material 2. The form of the electrode convexes 3 is not particularly limited and may be selected according to the purpose. The electrode convexes 3 may be in a form having a flat front end, for example, a cylindrical or prismatic form, or alternatively may be in a form having a curved front end, for example, a semispherical form. The electrode convexes 3 shown in FIG. 1 are in a prismatic form, and the front end face of the electrode convex 3 is in a quadrilateral form.

The height of the electrode convexes 3 provided in a protruded form on the surface of the electroconductive base material 2 is preferably 5 nm to 100 nm when the surface of the electroconductive base material 2 is taken as a reference plane.

(Electrode Terminal)

The electrode terminal 4 is provided on the electroconductive base material 2 and may be formed of a material usable as a conventional electrode terminal.

The electrode terminal 4 is conducted to all the plurality of electrode convexes 3 provided on the surface of the electroconductive base material 2.

When the electroconductive base material 2 and the electrode convexes 3 are formed of an electroconductive material, there is no need to specially provide a lead wire between the electrode terminal 4 and the electrode convexes 3 for conduction therebetween.

The position at which the electrode terminal 4 is provided is not particularly limited and may be selected according to the purpose.

[Process for Producing Electrode Master for Ferroelectric Recording]

FIGS. 2A to 2E are explanatory views illustrating a process for producing an electrode master for ferroelectric recording. The process for producing the electrode master 1 for ferroelectric recording will be described with reference to FIGS. 2A to 2E. Here a process for producing the electrode master 1 for ferroelectric recording by electroforming using a predetermined mother die will be described as one embodiment.

Figure 2A:
FIG. 2A is an explanatory view illustrating a process for producing an electrode master for ferroelectric recording (part 1)

As shown in FIG. 2A, an original plate 30 of silicon is first provided. An electron beam resist liquid is applied over a surface of the original plate 30 to form a resist layer 31. The electron beam resist liquid may be applied by a conventional coating method such as spin coating. The resist layer 31 is then baked (prebaked).

Figure 2B:
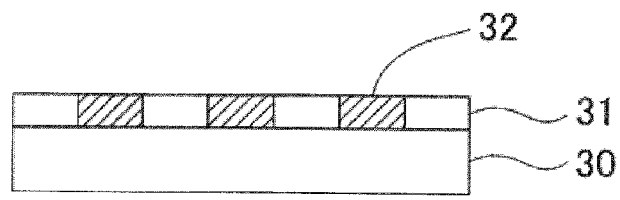
FIG. 2B is an explanatory view illustrating a process for producing an electrode master for ferroelectric recording (part 2)

As shown in FIG. 2B, a predetermined pattern is written (EB drawing) with an electron beam exposure system (not shown) on the resist layer 31 provided on the original plate 30. In FIG. 2B, the position exposed to the electron beams (exposed area) is represented by a reference numeral 32.

Figure 2C:
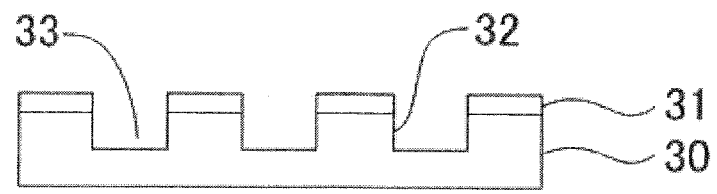
FIG. 2C is an explanatory view illustrating a process for producing an electrode master for ferroelectric recording (part 3)

Thereafter, the resist layer 31 is developed to remove the exposed area 32. Upon the removal of the resist layer 31 in its exposed area 32, as shown in FIG. 2C, a patterned resist layer 31 is provided. After the development, baking (post-baking) is carried out to enhance the adhesion between the resist layer 31 and the original plate 30.

Thereafter, etching is carried out using the patterned resist layer 31 as a mask, and concaves are formed in the original plate 30 through spaces in the resist layer 31 by etching. Anisotropic etching such as reactive ion etching (RIE) is preferred as the etching.

After the etching, convexes 32 and concaves 33 are formed in the original plate 30.

Thereafter, if necessary, the resist layer 31, which stays on the surface of the original plate 30, is removed to provide a mother die 40.

Figure 2D:
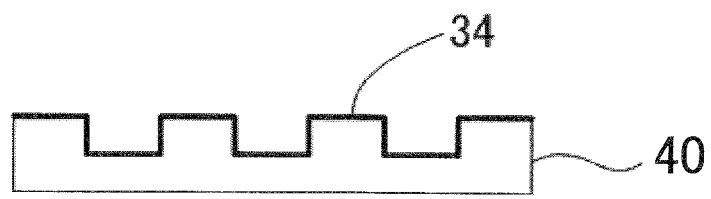
FIG. 2D is an explanatory view illustrating a process for producing an electrode master for ferroelectric recording (part 4)

As shown in FIG. 2D, an electroconductive film 34 of nickel (Ni) is then formed on the surface of the mother die 40 by a conventional method for metal film formation such as sputtering.

Figure 2E:
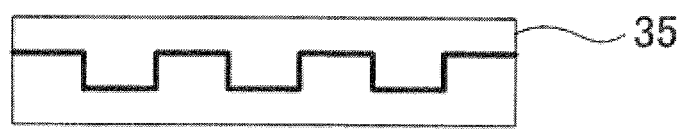
FIG. 2E is an explanatory view illustrating a process for producing an electrode master for ferroelectric recording (part 5)
Figure 2F:
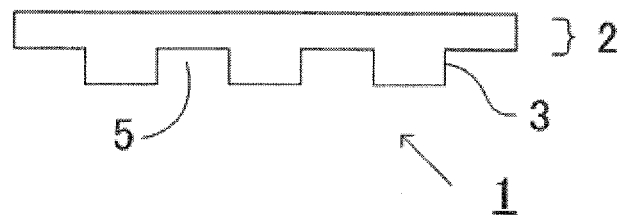
FIG. 2F is an explanatory view illustrating a process for producing an electrode master for ferroelectric recording (part 6)

Thereafter, as shown in FIG. 2E, the mother die 40 with the electroconductive film 34 formed thereon is subjected to electroforming to form a layer composed mainly of Ni (hereinafter referred to as "Ni layer") 35 on the electroconductive film 34.

Thereafter, the Ni layer 35 is peeled off from the mother die 40, is cleaned, and is dried to produce an electrode master 1 for ferroelectric recording. An electrode terminal(s) (not shown) is (are) mounted at predetermined positions of the electroconductive base material 2 in the electrode master 1 for ferroelectric recording.

Thus, the electrode master 1 for ferroelectric recording is produced.

In the above embodiment, Ni was used as a material for the electroconductive base material 2. The electroconductive base material 2 according to the present invention is not limited to Ni, and any material, which is electrically conductive, can easily be processed and can form a film, may be properly selected according to the purpose without particular limitation.

In another embodiment of the present invention, a thin film (film thickness: 10 nm or less) formed of a material composed of carbon may be formed on the surface of the electrode master 1 for ferroelectric recording (the surface of the electroconductive base material 2 and the surfaces of the electrode convexes 3) as a protective layer, for example, from the viewpoint of improving the durability.

Figure 3A:
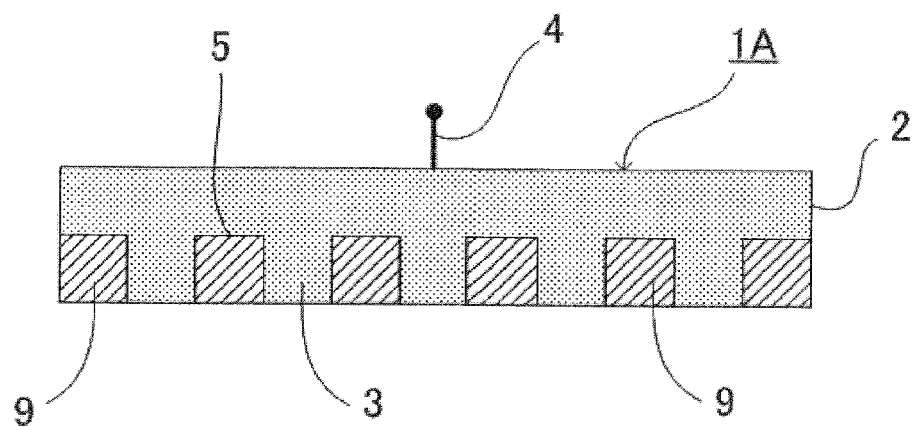
FIG. 3A is a schematic explanatory view illustrating an electrode master for ferroelectric recording according to another embodiment of the present invention.

In still another embodiment of the present invention, as in the electrode master 1A for ferroelectric recording shown in FIG. 3A, spaces (concaves 5) between the electrode convexes 3 provided in a protruded form on the surface of the electroconductive base material 2 may be filled with an insulator 9 such as a resin. The thickness of the insulator 9 is preferably set to a height equal to or smaller than the height of the electrode convexes 3. In FIG. 3A, the insulator 9 is filled to the front end face of the electrode convexes 3.

Figure 3B:
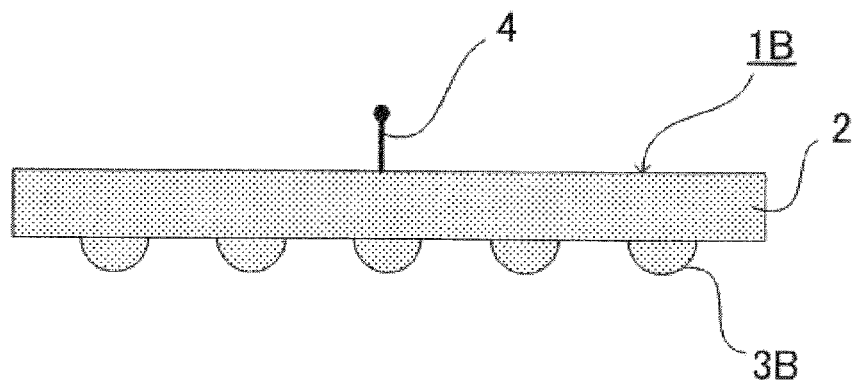
FIG. 3B is a schematic explanatory view illustrating an electrode master for ferroelectric recording according to still another embodiment of the present invention.

In a further embodiment of the present invention, as in an electrode master 1B for ferroelectric recording shown in FIG. 3B, the form of electrode convexes 3B formed on the surface of the electroconductive base material 2 may be semispherical.

Figure 3C:
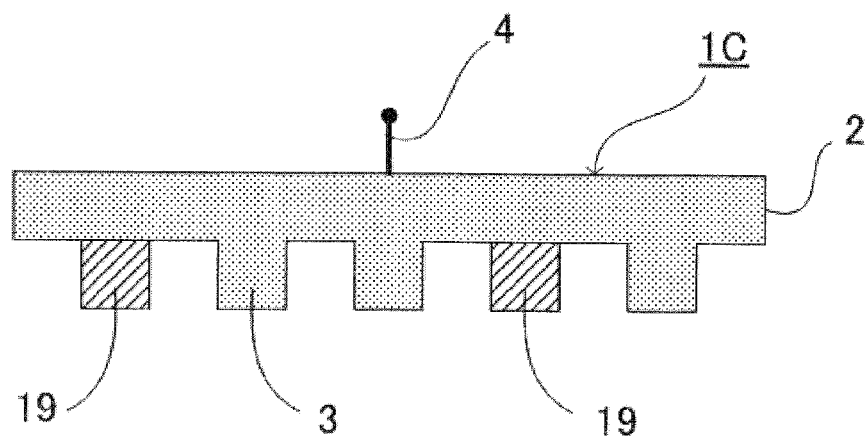
FIG. 3C is a schematic explanatory view illustrating an electrode master for ferroelectric recording according to still yet another embodiment of the present invention.

In a still yet another embodiment of the present invention, as in an electrode master 1C for ferroelectric recording shown in FIG. 3C, in addition to the electrode convexes 3, insulating convexes 19 formed of an insulator may be provided on the surface of the electroconductive base material 2. The height of the insulating convexes 19 is the same as the height of the electrode convexes 3. The provision of the insulating convexes 19 in addition to the electrode convexes 3 on the surface of the electroconductive base material 2 in this manner is advantageous in that, upon the contact of the electrode convexes 3 in the electrode master 1C for ferroelectric recording with the surface of the ferroelectric recording medium, the stability of the electrode master 1C for ferroelectric recording can be improved and, thus, the electrode convexes 3 can be reliably brought into contact with the ferroelectric recording medium.

For example, when the distance between the electrode convexes 3 is 100 bits or more, the insulating convexes 19 are preferably provided between the electrode convexes 3. The provision of the insulating convexes 19 in this manner can suppress the deflection of the electroconductive base material 2 in the electrode master 1C for ferroelectric recording.

[Ferroelectric Recording Medium]

The ferroelectric recording medium 6 is a recording medium (a slave) including a recording layer formed of a ferroelectric material. Information is recorded on the ferroelectric recording medium 6 based on the direction of polarization of the ferroelectric material.

The form of the ferroelectric recording medium 6 is not particularly limited and may be properly selected according to the purpose, and the ferroelectric recording medium 6 may be, for example, in a disc form.

Preferably, the ferroelectric recording medium 6 has a large electric flux density D during the application of a voltage H, has a high squareness ratio in a D-H hysteresis, and has an antielectric field of 1V to 100V. The antielectric field of the ferroelectric recording medium 6 is particularly preferably 2V to 10V from the viewpoints of ease of the manufacture of a recording electric field system and freedom from erasing by a floating electric field after recording.

Examples of the ferroelectric material used in the recording layer in the ferroelectric recording medium 6 include $LiTaO_3$, $PbTiO_3$, and $PbZrO_3$.

In the ferroelectric material in the recording layer in the ferroelectric recording medium 6, preferably, a voltage is previously applied before recording to unify the direction of polarization in one direction. The direction of polarization is not particularly limited and may be properly selected according to the purpose. From the viewpoint of high-density recording, however, preferably, the direction of polarization is unified in the thickness-wise direction of the recording layer (ferroelectric recording medium 6).

Figure 4A:
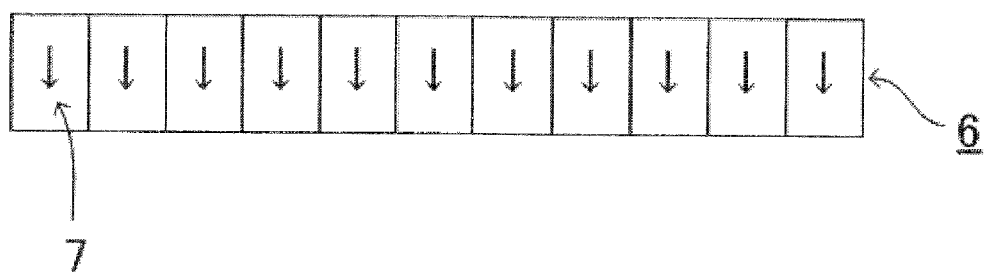
FIG. 4A is a schematic explanatory view illustrating a ferroelectric recording medium in which the direction of polarization has been unified in one direction.

FIG. 4A is an explanatory view showing a disc-shaped ferroelectric recording medium 6 in such a state that the direction of polarization of the ferroelectric material has been unified in one direction. In FIG. 4A, an arrow indicated by a reference numeral 7 represents the direction of polarization in one domain in the ferroelectric material. The direction of polarization in each domain can be unified in one direction, for example, by externally applying a voltage having a predetermined strength (an initialization voltage) in the thickness-wise direction of the ferroelectric recording medium (a direction perpendicular to the surface of the ferroelectric recording medium 6).

Figure 4B:
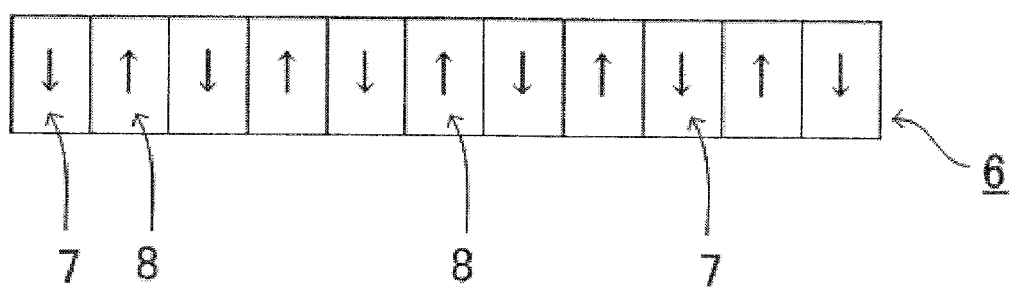
FIG. 4B is a schematic explanatory view illustrating a ferroelectric recording medium with information recorded thereon.

FIG. 4B is an explanatory view showing a disc-shaped ferroelectric recording medium 6 in such a state that information has been recorded by reversing the direction of polarization of a part of the ferroelectric material. Upon the application of voltage pulses on a level of the antielectric field or more to the ferroelectric recording medium 6 in a direction opposite to the initialization voltage, the direction of polarization of the ferroelectric material in its parts (domains) to which the voltage pulses have been applied is reversed (see arrows indicated by a reference numeral 8) to record information. The reversion of the direction of polarization of the ferroelectric material results in the reversed signs of the nonlinear permittivity of the ferroelectric material.

The reversion of the signs of the nonlinear permittivity of the ferroelectric material can be confirmed by a conventional device utilizing an SNDM technique, and the information recorded on the ferroelectric recording medium 6 can be reproduced using the device. A device described, for example, in Japanese Patent Application Laid-Open (JP-A) No. 2004-14016 may be mentioned as the device.

[Method for Recording on Ferroelectric Recording Medium Using Electrode Master for Ferroelectric Recording]

The method for recording on a ferroelectric recording medium using the electrode master for ferroelectric recording will be described with reference to FIG. 1.

As shown in FIG. 1, the electrode master 1 for ferroelectric recording is disposed on the ferroelectric recording medium 6 so that the electrode convexes 3 come into contact with the surface of the ferroelectric recording medium 6. A plate-like back plate 11 as another electrode is disposed on the other surface of the ferroelectric recording medium 6. The electrode master 1 for ferroelectric recording is electrically connected to the back plate 11 through a lead wire 20. One end of the lead wire 20 is connected to the electrode terminal 4 of the electrode master 1 for ferroelectric recording. A direct-current power supply 12 and a pulse generator 13 are provided at an intermediate position of the lead wire 20 connecting the electrode master 1 for ferroelectric recording to the back plate 11. The lead wire 20 is connected to ground 14 at its intermediate position.

In the ferroelectric recording medium 6, the direction of polarization of the ferroelectric material has been previously unified in one direction. In this embodiment, the direction of polarization of the ferroelectric material in the ferroelectric recording medium 6 has been previously unified in a direction indicated by a reference numeral 7.

In such a state that the electrode master 1 for ferroelectric recording and the like are set as described above, voltage pulses are applied to the ferroelectric recording medium 6. The magnitude of the voltage pulses is set to a level of the antielectric field or more of the ferroelectric recording medium 6.

The voltage pulses are applied, for example, at 6V for 100 µs and at 8V for 100 ns.

Upon the application of voltage pulses to the ferroelectric recording medium 6, the direction of polarization of the ferroelectric material is reversed at positions where the electrode convexes 3 in the electrode master 1 for ferroelectric recording come into contact with the ferroelectric recording medium 6 (see an arrow indicated by a reference numeral 8 in FIG. 1).

Thus, pieces of information are simultaneously recorded on the ferroelectric recording medium 6.

In another embodiment of the present invention, a method may be adopted in which recording is performed in such a state that, without the contact of the electrode convexes 3 in the electrode master 1 for ferroelectric recording with the ferroelectric recording medium 6, the electrode convexes 3 are disposed at positions near the surface of the ferroelectric recording medium 6.

The expression "positions near the surface" means that the distance of the position of the front end (front end face) of the electrode convexes 3 in the electrode master 1 for ferroelectric recording from the surface of the ferroelectric recording medium 6 is about 20 nm or less.

What is claimed is:

1. An electrode master for ferroelectric recording that records information on a ferroelectric recording medium in which the direction of polarization of a ferroelectric material has been unified in one direction by applying a voltage thereto, based on the direction of polarization of the ferroelectric material by applying voltage pulses to the ferroelectric recording medium, the electrode master comprising:
    an electroconductive base material;
    a plurality of electrode convexes provided on a surface of the electroconductive base material so as to correspond to information to be recorded on the ferroelectric recording medium; and
    an electrode terminal conducted to each of the electrode convexes and provided on the electroconductive base material.

2. The electrode master for ferroelectric recording according to claim 1, wherein the electrode convexes and the electroconductive base material are formed of a metal.

3. The electrode master for ferroelectric recording according to claim 1, wherein concaves between the electrode convexes provided on the surface of electroconductive base material are filled with an insulator.

4. The electrode master of claim 1, wherein each of the plurality of convexes is separated from an adjacent one of the plurality of convexes by a concavity.

5. A method for recording on a ferroelectric recording medium, comprising:
    placing a ferroelectric recording medium, on which information is recorded based on the direction of polarization of a ferroelectric material, between an electrode master for ferroelectric recording and another electrode so as to bring a plurality of electrode convexes in the electrode master for ferroelectric recording into contact with the ferroelectric recording medium; and applying voltage pulses to the ferroelectric recording medium so that the direction of polarization of a ferroelectric material is unified in one direction to thereby record a plurality of pieces of information on the ferroelectric recording medium, wherein the electrode master for ferroelectric recording comprises an electroconductive base material; a plurality of electrode convexes provided on a surface of the electroconductive base material so as to correspond to information to be recorded on the ferroelectric recording medium; and an electrode terminal conducted to each of the electrode convexes and provided on the electroconductive base material.

6. The method for recording on a ferroelectric recording medium according to claim 5, wherein voltage pulses are applied to the ferroelectric recording medium with allowing the plurality of electrode convexes in the electrode master for ferroelectric recording to come close to, but allowing these electrode convexes to contact with, the ferroelectric recording medium to record a plurality of pieces of information on the ferroelectric recording medium.

7. The method of claim 5, wherein each of the plurality of convexes in the electrode master is separated from an adjacent one of the plurality of convexes by a concavity.

8. A ferroelectric recording medium on which information is recorded by using an electrode master for ferroelectric recording, wherein the electrode master for ferroelectric recording comprises an electroconductive base material; a plurality of electrode convexes provided on a surface of the electroconductive base material so as to correspond to information to be recorded on the ferroelectric recording medium in which the direction of polarization of a ferroelectric material has been unified in one direction by applying a voltage thereto, based on the direction of polarization of the ferroelectric material by applying voltage pulses to the ferroelectric recording medium; and an electrode terminal conducted to each of the electrode convexes and provided on the electroconductive base material.

9. The recording medium of claim 8, wherein each of the plurality of convexes in the electrode master is separated from an adjacent one of the plurality of convexes by a concavity.

* * * * *